United States Patent
Darling et al.

(10) Patent No.: US 10,305,421 B1
(45) Date of Patent: May 28, 2019

(54) ADAPTIVE LIGHT MANAGEMENT IN SOLAR CELLS

(71) Applicant: Energy, United States Department of, Washington, DC (US)

(72) Inventors: Seth B Darling, Chicago, IL (US); Omar Daniel Lopez, Chicago, IL (US)

(73) Assignee: U.S. Department of Energy, Washington, D.C.

( * ) Notice: Subject to any disclaimer, the term of this patent is extended or adjusted under 35 U.S.C. 154(b) by 212 days.

(21) Appl. No.: 15/194,983

(22) Filed: Jun. 28, 2016

(51) Int. Cl.
*H02S 20/32* (2014.01)
*H02S 40/22* (2014.01)
*H01L 31/054* (2014.01)
*H01L 31/056* (2014.01)

(52) U.S. Cl.
CPC ............ *H02S 40/22* (2014.12); *H01L 31/056* (2014.12); *H01L 31/0547* (2014.12); *H02S 20/32* (2014.12); *Y02E 10/52* (2013.01)

(58) Field of Classification Search
CPC .......... H02S 20/32; H02S 40/22; H02S 30/20; H01L 31/0547; H01L 31/056; Y02E 10/52
See application file for complete search history.

(56) References Cited

U.S. PATENT DOCUMENTS

| | | | |
|---|---|---|---|
| 8,835,861 B1* | 9/2014 | Cabrera | B81B 3/0024 250/338.4 |
| 2005/0061364 A1* | 3/2005 | Peumans | H01L 51/0026 136/263 |
| 2005/0200984 A1* | 9/2005 | Browne | B60R 1/08 359/846 |
| 2009/0103165 A1* | 4/2009 | Kothari | G02F 1/13306 359/290 |
| 2010/0238572 A1* | 9/2010 | Tao | B81B 3/0086 359/849 |

* cited by examiner

*Primary Examiner* — Lindsey A Bernier
(74) *Attorney, Agent, or Firm* — Karen L. Blouin; Michael J. Dobbs; Brian J. Lally

(57) ABSTRACT

A solar cell system is formed with a dynamic surface relief grating. Movement members are actuated by a controller to produce a force on the reflective surface. The reflective surface deforms in response to the force creating a surface relief grating that can adapt to changing light conditions.

19 Claims, 6 Drawing Sheets

ADAPTIVE LIGHT MANAGEMENT IN SOLAR CELLS

GOVERNMENT INTERESTS

The United States Government has rights in this invention pursuant to Contract No. DE-AC02-06CH11357, between the U.S. Department of Energy (DOE) and UChicago Argonne, LLC as operator of Argonne National Laboratory.

FIELD OF THE INVENTION

The present invention relates to a solar cell system in which the surface relief grating of the solar cell adapts to changing light conditions.

BACKGROUND OF THE INVENTION

Efficiencies of photovoltaic cells, in particular next-generation technologies such as organic photovoltaic cells (OPV), must be increased to achieve commercial viability in expanding applications. Specifically, efficiency in technologies such as OPVs is often limited by weak light absorption in the active layer. To compensate, active layer thickness is increased. However, increasing the active layer thickness results in fewer charge carriers successfully reaching their respective electrodes and ultimately the external load. In OPVs, in particular, the polymers and other organic semiconductors that are used in the active layer have charge carriers with mobilities that are lower than traditional inorganic counterparts.

Rather than increasing the active layer thickness, light absorption can be increased by increasing the effective path length for photons through light trapping. Instead of traveling through the solar cell unabsorbed, a reflective electrode reflects light that enters the solar cell and allows it additional opportunities to be absorbed by the solar cell. Employing static structures in the reflective electrode, Surface Relief Gratings (SRGs), further enhances light absorption. Periodic, sub-micrometer substrate structures can trap light within the active layer by reflecting it at higher angles back through the film rather than letting it reflect straight out of the device as with a flat substrate. SRG's can also be used with non-OPVs such as crystalline silicon photovoltaic cells.

However, the geometry of the SRG must be optimized for a given set of conditions, including the angle of light incidence. A solar module experiences a broad range of incident angles as the sun traverses the sky during the day; moreover, clouds, precipitation, and seasonal changes can also affect the ambient light environment. Accordingly if the SRG is static, optimal conditions are only met for one instant on one day per year. Therefore a need exists in the industry to provide solar cell systems with SRGs that adapt to changing light conditions.

SUMMARY OF THE INVENTION

According to one aspect of the invention, a solar cell system is provided. The solar cell system includes a solar cell, a reflective surface, and a movement unit. The reflective surface occupies a plane and has a top face and a bottom face. An axis is defined to be perpendicular to the reflective surface. The movement unit includes at least one movement member adjacent the bottom face of the reflective surface. The output of the controller of the movement unit is coupled to the movement member such that the controller actuates the movement member to apply a force to at least a portion of the bottom face of the reflective surface. A portion of the reflective surface deforms in response to the force.

In another aspect of the invention, a method for optimizing light absorption in a solar cell system includes positioning a solar cell system in a predetermined location. The solar cell system includes a solar cell, a reflective surface and a movement unit including a plurality of movement members and a controller. A plurality of movement members are disposed adjacent the bottom face of the reflective surface. A first value of the solar cell output is set in the controller. The controller selectively actuates at least one of the plurality of movement members. Regulating the output of the solar cell includes receiving a second value of the solar cell output at the controller. The second value of the solar cell output is compared to the first value of the solar cell output. At least one of the plurality of movement members is actuated by the controller to optimize the solar cell output. Force is applied to the reflective surface by at least one of the plurality of movement members and at least a portion of the reflective surface is deformed. The first value of the solar cell output is replaced with the second value of the solar cell output. This iterative process ensures optimal light absorption by the solar cell system and thereby optimal device performance.

In yet a further aspect of the invention, a method for forming a solar cell in accordance with the invention includes thermally evaporating a reflective electrode onto a continuous planar membrane. An electron transport layer followed by an active layer of ink are coated onto the reflective electrode. A hole transport layer of ink is coated onto the active layer. The solar cell system is annealed in a vacuum followed by a transparent conductive layer being thermally deposited onto the hole transport layer. The solar cell system is then encapsulated.

DETAILED DESCRIPTION OF THE INVENTION

Figure 1:
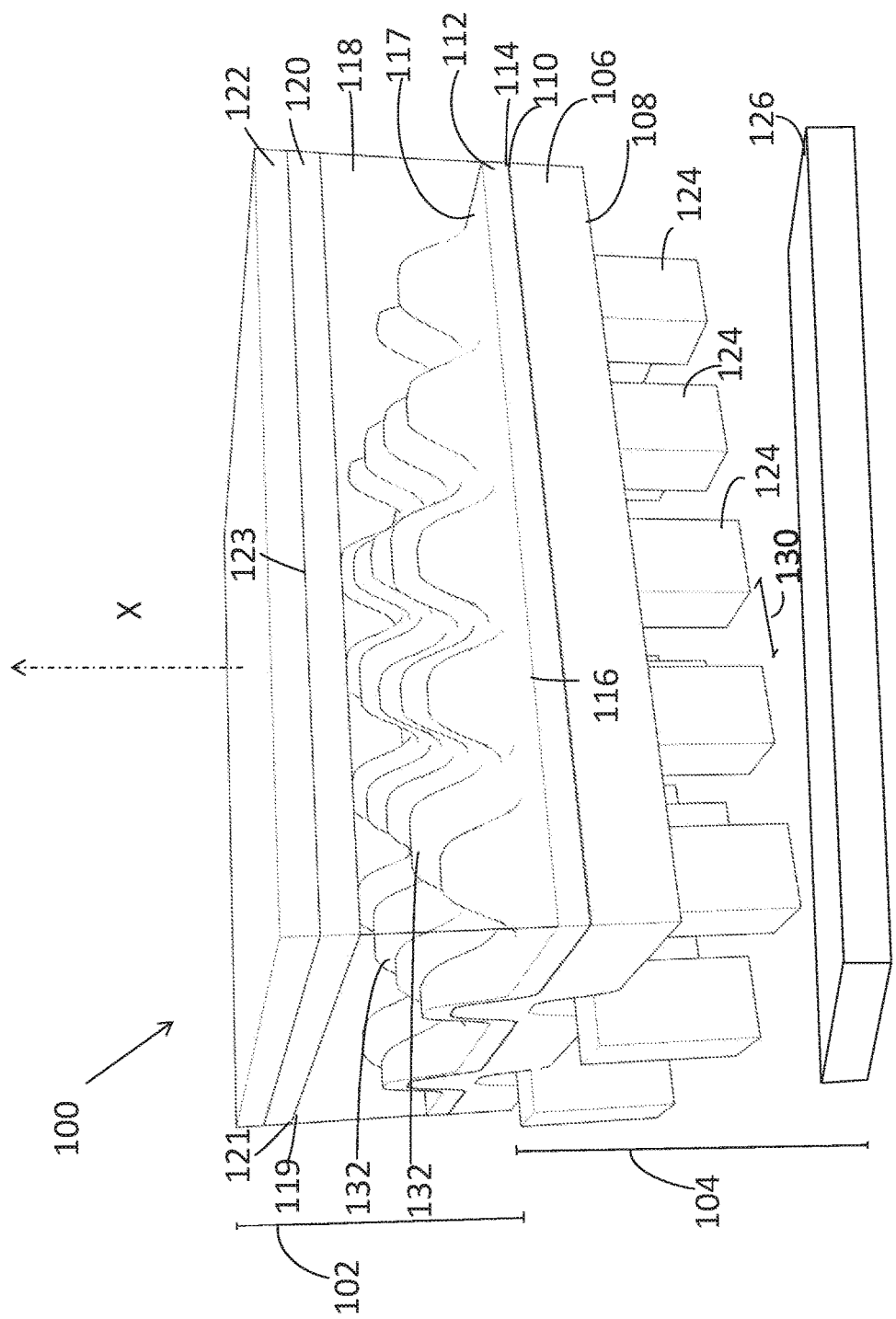
FIG. 1 is an isometric view of a first embodiment of a solar cell system according to the invention.

Solar cell systems according to the invention can be used to form a solar panel, array or module in which the solar cell systems adapt to changing light conditions. One embodiment of the solar cell system 100 is illustrated in FIG. 1. The solar cell system 100 includes a solar cell 102, a reflective surface 106, and a movement unit 104. The solar cell or photovoltaic device 102 is an electrical device that converts the energy of light into electricity. The solar cell 102 of the solar cell system 100 may be an OPV or any other mechanically flexible solar cell that performs within an acceptable range including but not limited to perovskite photovoltaics and dye-sensitized solar cells.

The solar cell 102 in the embodiment illustrated in FIG. 1 includes a reflective surface 106, a first transport layer 112, an active layer 118, a second transport layer 120 and a transparent electrode 122. Alternate embodiments may have solar cells 102 with additional or different layers and/or electrodes. Specifically, alternate embodiments may include a reflective surface 106 that is not an integral part of the solar cell but is adjacent to a transparent electrode disposed between the reflective surface 106 and the first transport layer 112.

In the illustrated embodiment the reflective surface 106 is a reflective electrode. The reflective electrode 106 aids in increasing the efficiency of the solar cell 102 by allowing for light trapping. The reflective electrode 106 has a top face 110 and a bottom face 108 opposed to the top face 110. In the illustrated embodiment the reflective electrode 106 is represented by a single physical layer but in practice one or more layers of material may perform as a reflective electrode 106. Aluminum may be used in forming a reflective electrode 106 or any other material may be used such that it provides the necessary characteristics. The reflective electrode 106 substantially occupies a plane and an axis X is defined to be perpendicular to the plane.

In the illustrated embodiment, the solar cell includes a first transport layer 112. The first transport layer 112 has a top surface 116 and a bottom surface 114. The bottom surface of the first transport layer 114 is adjacent the top face of the reflective electrode 110. The first transport layer 112 may be formed with Calcium or any other material that provides the necessary characteristics. The first transport layer 112 substantially occupies the same plane as the reflective electrode 106. In some embodiments the first transport layer 112 is an electron transport layer. In alternate embodiments the first transport layer 112 is a hole transport layer.

An active layer 118 has a bottom surface 117 that is disposed adjacent a top surface of the first transport layer 116. A bottom surface of a second transport layer 121 is disposed adjacent a top surface of the active layer 119. A transparent electrode 122 is disposed adjacent a top surface of the second transport layer 123. In embodiments in which the first transport layer 112 is an electron transport layer, the second transport layer 120 is a hole transport layer. In embodiments in which the first transport layer 112 is a hole transport layer, the second transport layer 120 is an electron transport layer. Layers 112, 118, 120, 122 occupy substantially the same plane as the reflective surface 106.

A movement unit 104 of the solar cell system 100 creates dynamic structures or dynamic surface relief grating (SRG) on the reflective surface 106 such that the solar cell system 100 can adapt to varying light conditions and maintain optimal light absorption. The movement unit 104 includes at least one movement member 124 and a controller 126. In the embodiment illustrated in FIG. 1, the movement member 124 is a nanostructure. Other embodiments may have movement members 124 that are microstructures, air jets or any other apparatus or device that can be controlled by the controller 126 and apply a force to the bottom face of the reflective surface 108. In the embodiment illustrated in FIG. 1 there are multiple movement members 124 adjacent the bottom surface of the reflective surface 108. Alternate embodiments may have a different number of movement members 124 or just one movement member adjacent the bottom face of the reflective surface 108. The movement members 124 are arranged in an array in the illustrated embodiment. Alternate embodiments may have movement members 124 arranged in a different manner. In the illustrated embodiment the movement members 124 are rectangular prisms and spaced apart from each other at a predetermined distance 130. Other embodiments may have movement members that are different shapes and spaced apart at distances other than the predetermined distance 130 illustrated in FIG. 1.

The output of the controller 126 is coupled to the movement member 124 and the controller 126 actuates the movement members 124. The controller 126 may be a microprocessor, analog switch, user input or any other device or apparatus that can be used to actuate the movement member 124. When actuated, the movement members 124 apply a force to at least a portion of the bottom surface of the reflective surface 108.

In the embodiment illustrated in FIG. 1, the reflective electrode 106, first transport layer 112 and active layer 118 deform relative to the plane in response to the force. The pattern of the SRG or grating pattern 132 is illustrated on the top surface of the first transport layer 116. As illustrated, the active layer 118 of the solar cell 102 of system 100 is flexible and adapted to accept the deformation of the reflective electrode 106 and first transport layer 112. In alternate embodiments either or both of the second transport layer 120 and transparent electrode 122 may also deform relative to the plane in response to the force applied by the movement members 124. The grating pattern 132 may vary in alternate embodiments as a function of the shape, size and spacing of the movement members 124.

Mechanically flexible solar cells such as organic, perovskite, dye-sensitized, amorphous silicon, cadmium telluride, and copper indium gallium selenide may be used in the solar cell system 100 according to the invention. Thickness of the active layer 118 may vary such that the electricity produced by the solar cell system 100 is acceptable for the application in which it is being used.

Figure 2:
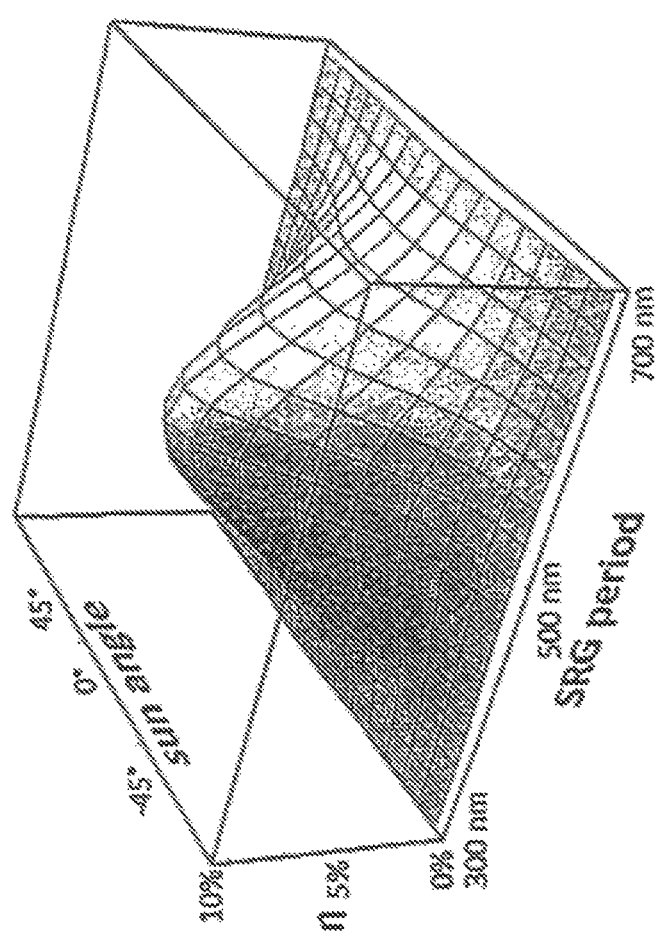
FIG. 2 is a schematic of OPV conversion efficiency as a function of SRG period and illumination angle.

FIG. 2 illustrates schematically the SRG lateral periodicity and/or depth in relation to device power conversion efficiency and illumination angle. As the SRG lateral periodicity and/or depth is varied, there will be an optimal device efficiency. The optimal structure applies only for one specific incident angle of light and ambient environmental condition. As the angle of illumination or other aspect of the environment is varied, the optimal power point will shift to different SRG geometries. The deformation of the reflective surface 106 and/or other layers of the solar cell 102 allows for dynamic deformation of the grating pattern 132.

In some embodiments, the movement unit 104 is a nanoelectromechanical system (NEMS), which is a class of devices that integrate electrical and mechanical functionality on the nanoscale. In alternate embodiments, the movement unit 104 may be microelectromechanical systems (MEMS), thermally actuated pistons, or any other system that produces acceptable results. The NEMS includes both the movement member 124 and controller 126. In the instances a NEMS is a movement unit, the movement members 124 are nanostructures.

The size of each of the movement members 124 in the embodiment illustrated in FIG. 1 is approximately 100-2000 nanometers. Each nanostructure or movement member 124 in this embodiment moves approximately 500+/−500 nanometers. In the illustrated embodiment, the movement members 124 are spaced approximately 100-10000 nanometers from adjacent movement members 124. Alternate embodiments may have movement members 124 of varied sizes and spacing with different movement ranges. In some embodiments the size and spacing of the movement members 124 may vary depending on the thickness or other parameters of an active layer 118 of the solar cell 102.

The nanostructures or movement members 124 of FIG. 1 move vertically or in alignment with the axis X (piston motion). Other embodiments may have movement members 124 that move in directions that are not in alignment with the axis X. Movement members 124 may be electrostatically driven, piezoelectric or elastomeric or any other type of movement member 124 that provides the desired force. The movement members 124 may be actuated individually or groups of movement members 124 may be actuated simultaneously. The movement members 124 have a neutral position in which the bottom face of the reflective surface 108 is not deformed. The movement members 124 have a fully extended position, relative to the plane, in which the maximum deformation of the reflective surface 106 is achieved. The movement members 124 can be positioned in an infinite number of incremental positions between the neutral position and the fully extended position. Alternate embodiments may have a limited number of preset positions in between the neutral position and the fully extended position.

The deformation of the reflective surface 106 enables the solar cell system 100 to dynamically track incident light. By changing the height of the movement members 124, the path of light within the active layer 118 can be changed. Controlling the spatial arrangement of the movement members 124 allows the design of a wavelength-tunable grating.

Figure 3:
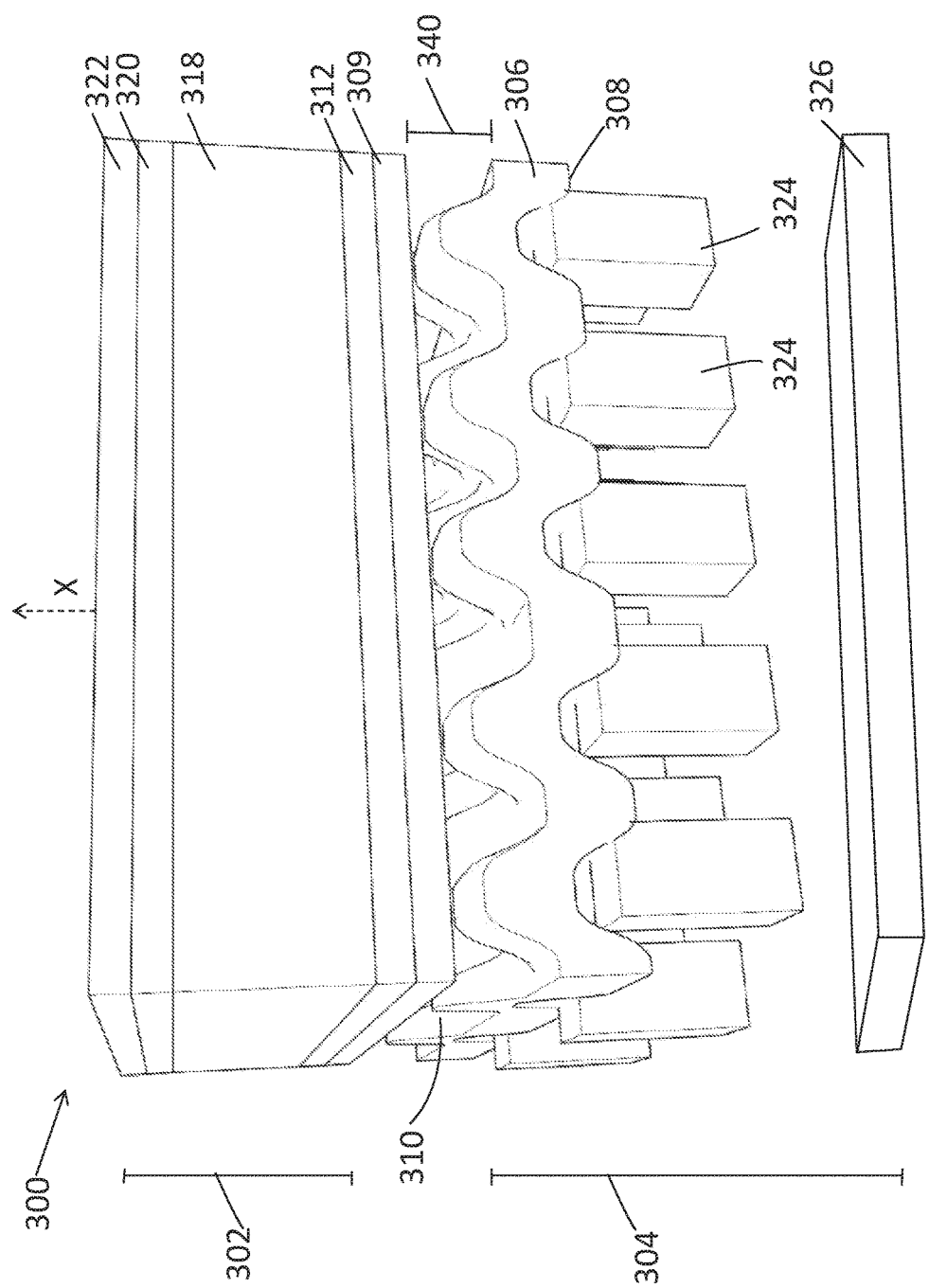
FIG. 3 is an isometric view of a second embodiment of a solar cell system according to the invention.

FIG. 3 illustrates a second embodiment of the solar cell system 300. The solar cell system 300 includes a solar cell 302, a reflective surface 306 and a movement unit 304. The solar cell 302 in the embodiment illustrated in FIG. 3 includes a first transparent electrode 309, an first transport layer 312, an active layer 318, a second transport layer 320 and a second transparent electrode 322 that are in alignment with and adjacent each other. Alternate embodiments may have additional or fewer layers in the solar cell 302 such that the solar cell produces electricity. The reflective surface 306 has a top face 310 and a bottom face 308 opposed to the top face 310. The reflective surface 306 substantially occupies a plane and an axis X is defined to be perpendicular to the plane.

In the embodiment illustrated in FIG. 3, the first transparent electrode 309 is disposed in alignment with and a predetermined distance 340 from the top face of the reflective surface 310. The first transparent electrode 309 is perpendicular to the axis X. Accordingly a gap 340 is disposed between the first transparent electrode 309 and the reflective surface 306.

The first transport layer 312 of the solar cell 302 may be an electron transport layer. If the first transport layer 312 is an electron transport layer, the second transport layer 320 will be a hole transport layer. Alternate embodiments may have a hole transport layer as a first transport layer 312 and an electron transport layer as a second transport layer 320. As stated above, each of the solar cell 302 layers 309, 312, 318, 320, 322 are adjacent each other, are perpendicular to the axis X and substantially occupy the same plane as the reflective surface 306.

A movement unit 304 of the solar cell system 300 includes at least one movement member 324 and a controller 326. In the embodiment illustrated in FIG. 3 there are multiple movement members 324 adjacent the bottom face of the reflective surface 308.

The output of the controller 326 is coupled to the movement member 324 and the controller 326 actuates the movement members 324. When actuated, the movement members 324 apply a force to at least a portion of the bottom face of the reflective surface 308. The reflective surface 306 deforms relative to the plane in response to the force. However, in this embodiment, the deformation of the reflective surface 306 extends into the gap 340 and the solar cell 302 does not deform.

The solar cell 302 in this system 300 may be rigid or mechanically flexible. Rigid solar cells such as monocrystalline silicon, polycrystalline silicon may be used in the solar cell system 300 according to the invention. In this embodiment the reflective surface 306 is structurally attached to the solar cell 302 by any means that allows for commercially acceptable results.

The controller 126, 326 can actuate the movement members 124, 324 in accordance with a predetermined movement pattern. For example, a movement pattern could be established in which the position of the movement members is calculated to optimize the angle of the sunlight. Accordingly, in this movement pattern, the movement members 124, 324 may be repositioned continuously in accordance with the sun's position in the sky or any other time interval that produces acceptable results. Other predetermined movement patterns may be seasonally based or time based. Any movement pattern that maximizes the capture of light by using reflected light may be used.

Figure 4:
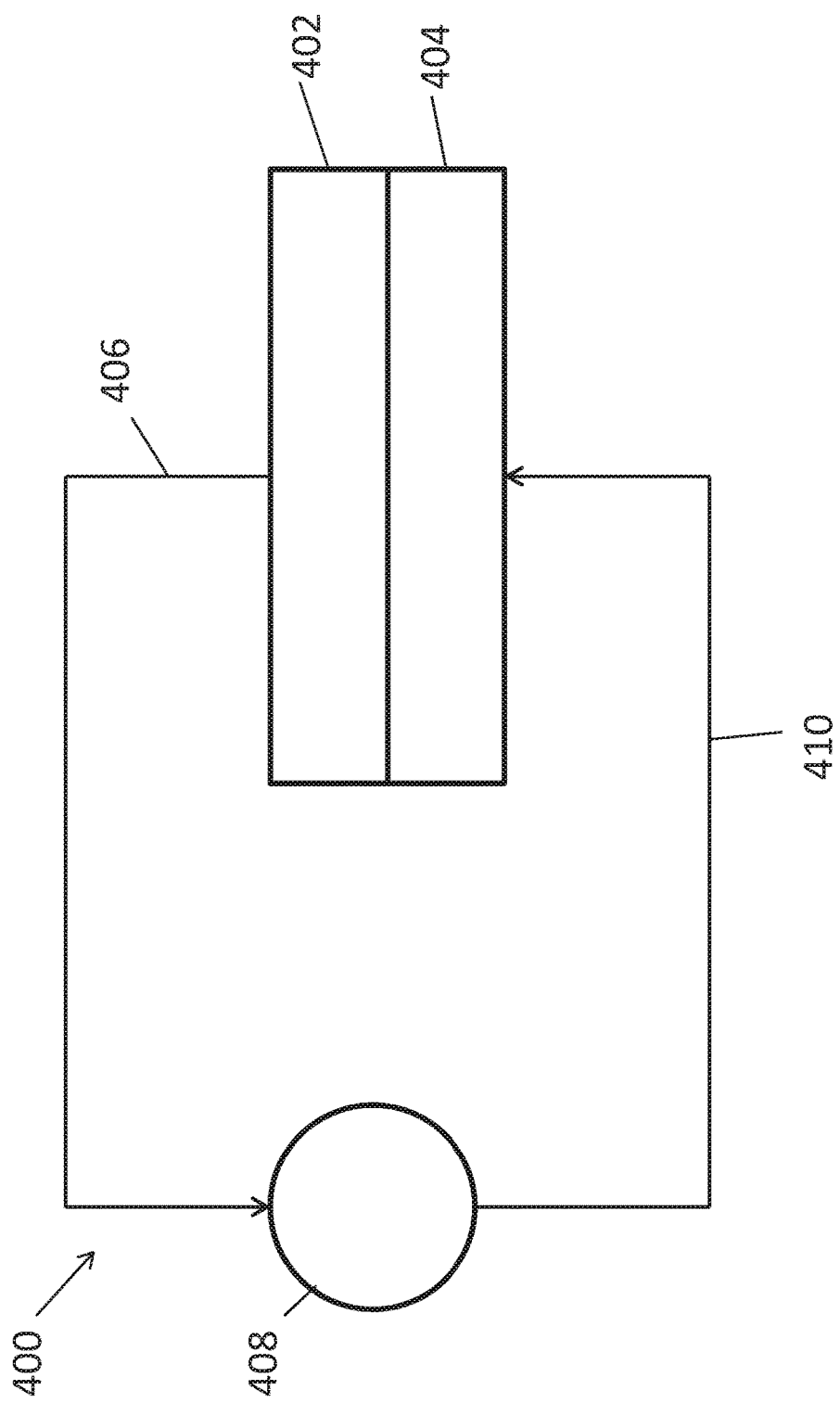
FIG. 4 is a schematic diagram of a third embodiment of a solar cell system according to the invention.

FIG. 4 illustrates an embodiment of a solar cell system 400 that includes a feedback unit 408. In this embodiment, the input of the controller 410 is coupled to an output of the solar cell 406. The output of the solar cell 406 represents the power produced by the solar cell 402. The feedback unit 408 monitors the current output of the solar cell 406. The feedback unit 408 transmits a signal 410 to the movement unit 404 such that the movement members are actuated to maximize the output of the solar cell 406.

In the illustrated embodiment of FIG. 4, an OPV 402 is integrated with a NEMS 404. The integration can be performed according to the method described below or any method that produces acceptable results and ensures that the OPV 402 is not delaminated or damaged.

Figure 5:
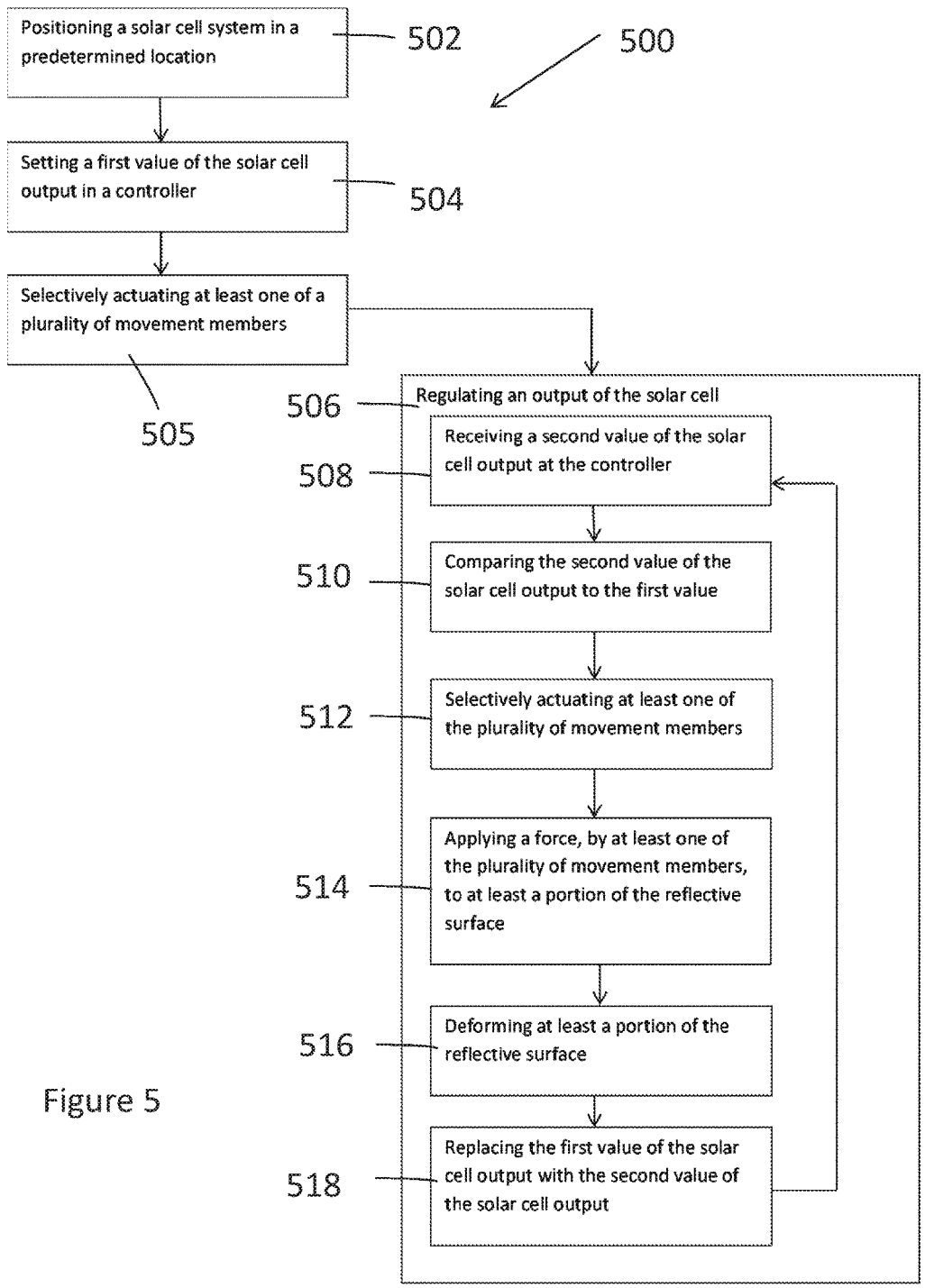
FIG. 5 is a schematic flow diagram illustrating steps of optimizing light absorption in a solar cell system according to the invention.

FIG. 5 illustrates a further aspect of the invention in which a method 500 for optimizing light absorption in a solar cell system is accomplished. First, and at step 502, a solar cell system is positioned in a predetermined location. The solar cell system includes a solar cell, a reflective surface, a plurality of movement members and a controller. The reflective surface has a bottom face with the movement members disposed adjacent the bottom face. At step 504 a first value of the solar cell output is set in the controller. In some embodiments the value of the solar cell output may be power. At least one of a plurality of movement members is actuated at step 505. The output of the solar cell is regulated at step 506. The regulating step 506 includes substeps 508-518. The controller receives 508 a second value of the solar cell output. The controller compares 510 the second value of the solar cell output to the first value. Responsive to the comparison, at least one of the plurality of movement members is actuated in step 512. The actuated movement member(s) apply 514 a force to at least a portion of the reflective surface. At least a portion of the reflective surface is deformed 516. The first value of the solar cell output is replaced with the second value of the solar cell output at step 518. The step of regulating the output of the solar cell 506 (substeps 508-518) is repeated.

Figure 6:
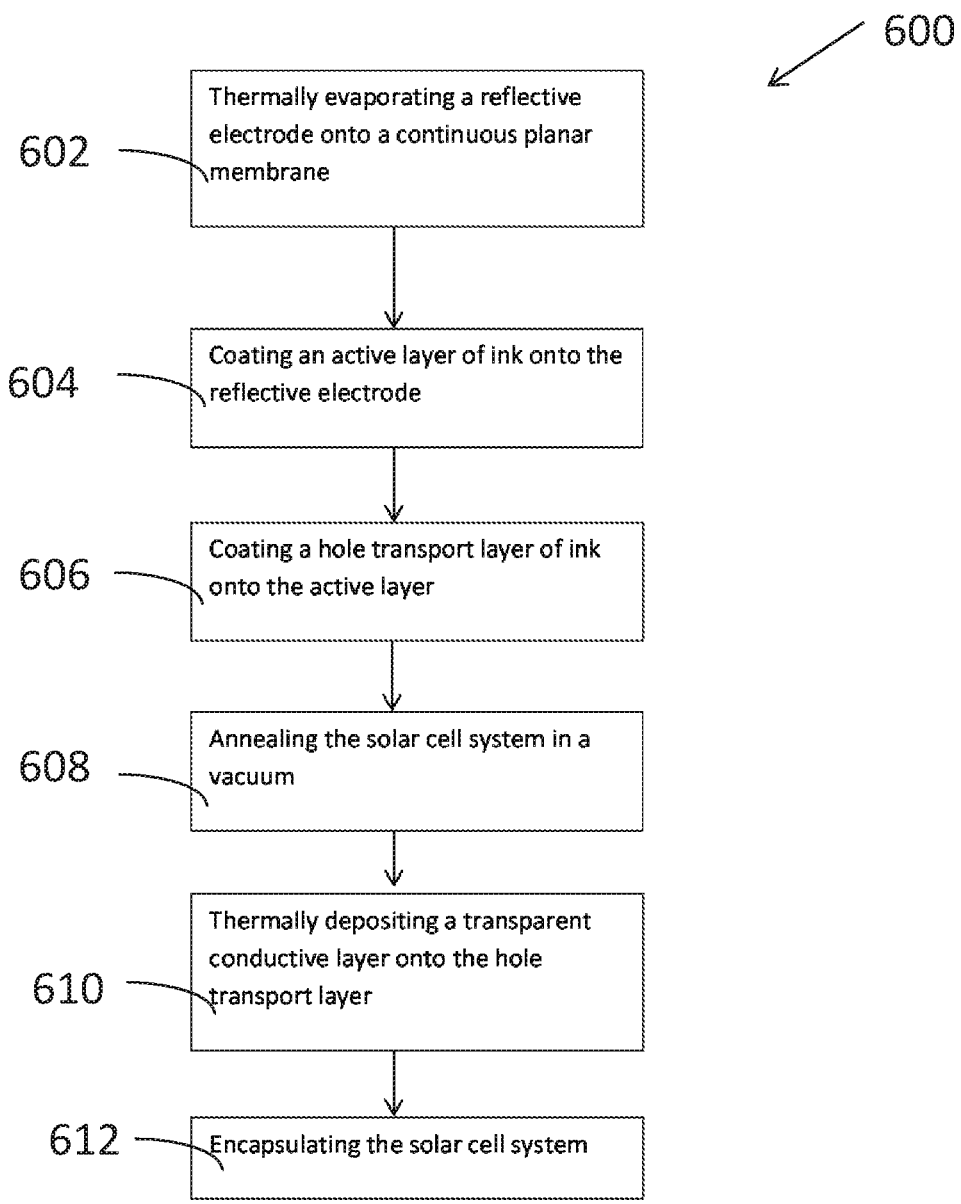
FIG. 6 is a schematic flow diagram illustrating steps in a manufacturing process according to the invention.

FIG. 6 illustrates a method 600 of making a solar cell system according to the invention. A reflective electrode is thermally evaporated 602 onto a continuous planar membrane. Next, an active layer of ink is coated 604 onto the reflective electrode. A hole transport layer of ink is coated 606 onto the active layer. The next step is to anneal 608 the solar cell system in a vacuum. A transparent conductive layer is thermally deposited 610 onto the hole transport layer. Finally, the solar cell system is encapsulated 612. An electron transport layer may also be coated onto the reflective membrane.

Although the present invention has been described by reference to its preferred embodiment as is disclosed in the specification and drawings above, many more embodiments of the present invention are possible without departing from the invention. Thus, the scope of the invention should be limited only by the impended claims.

It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements.

All publications and patent documents cited in this application are incorporated by reference in their entirety for all purposes to the same extent as if each individual publication or patent document were so individually denoted.

Any element in a claim that does not explicitly state "means for" performing a specified function, or "step for" performing a specific function, is not to be interpreted as a "means" or "step" clause as specified in 35 U.S.C. § 112, ¶6. In particular, the use of "step of" in the claims herein is not intended to invoke the provisions of 35 U.S.C. § 112, ¶6.

The invention claimed is:

1. A solar cell system that adapts to changing light conditions comprising:
   a solar cell comprising a reflective electrode;
   an axis defined perpendicular to the reflective electrode, the reflective electrode having a top face and a bottom face opposed to the top face, the top face of the reflective electrode being substantially planar;
   a movement unit, the movement unit including a plurality of movement members disposed adjacent the bottom face of the reflective electrode, each of the plurality of movement members being spaced apart from each other, each of the plurality of movement members having a plurality of movement member positions, the plurality of movement member positions including a neutral position, a fully extended position and a plurality of incremental positions in between the neutral position and the fully extended position;
   the movement unit further including a controller, the output of the controller coupled to each of the plurality of movement members wherein, responsive to changing light conditions, the controller actuates each of the plurality of movement members to move to one of the plurality of movement member positions, each of the plurality of movement members applying a force to at least a portion of the bottom face of the reflective electrode causing at least a portion of the reflective electrode to deform; and,
   a dynamic surface relief grating formed in at least a portion of the reflective electrode.

2. The solar cell system of claim 1, wherein the solar cell further includes a first transport layer, the first transport layer having a top surface and a bottom surface opposed to the top surface, the bottom surface of the first transport layer disposed adjacent the top face of the reflective electrode, an active layer disposed adjacent the top surface of the first transport layer, the first transport layer and active layer stacked on the reflective electrode, the dynamic surface relief grating formed in at least a portion of the first transport layer and active layer.

3. The solar cell system of claim 2, wherein the first transport layer is an electron transport layer.

4. The solar cell system of claim 2, wherein the first transport layer is a hole transport layer.

5. The solar cell system of claim 2, wherein the solar cell further includes a top surface of the active layer opposed to a bottom surface of the active layer, a second transport layer disposed adjacent the top surface of the active layer, the second transport layer having a top surface and a bottom surface opposed to the top surface, a transparent electrode disposed adjacent the top surface of the second transport layer, the second transport layer and transparent electrode stacked on the reflective electrode, the dynamic surface relief grating formed in at least a portion of the second transport layer and transparent electrode.

6. The solar cell system of claim 1, wherein each of the plurality of movement members is a nanostructure.

7. The solar cell system of claim 1, wherein each of the plurality of movement members has a range of motion substantially parallel to the axis.

8. The solar cell system of claim 1 wherein each of the plurality of movement members has a range of motion not in alignment with the axis.

9. The solar cell of claim 1, wherein at least two of the plurality of movement members may be actuated simultaneously.

10. The solar cell system of claim 1, wherein the movement unit is a nanoelectromechanical system.

11. The solar cell system of claim 10, wherein the nanoelectromechanical system includes electrostatically driven actuators.

12. The solar cell system of claim 1, wherein the movement unit is a microelectromechanical system.

13. The solar cell system of claim 1, wherein the controller actuates each of the plurality of movement members in accordance with a predetermined movement pattern.

14. The solar cell system of claim 1, wherein an input of the controller is coupled to an output of the solar cell, the output of the solar cell having a power value, the controller actuating each of the plurality of movement members to maximize the power value.

15. A solar panel comprising a plurality of solar cell systems according to claim 1.

16. The solar cell system of claim 1, wherein the solar cell is a mechanically flexible solar cell.

17. The solar cell system of claim 1, wherein the solar cell includes a first transparent electrode, a first transport layer disposed adjacent the first transparent electrode, an active layer disposed adjacent the first transport layer, a second transport layer disposed adjacent the active layer and a second transparent electrode disposed adjacent the second transport layer.

18. The solar cell system of claim 17, wherein the first transport layer is an electron transport layer and the second transport layer is a hole transport layer.

19. The solar cell system of claim 17, wherein the first transport layer is a hole transport layer and the second transport layer is an electron transport layer.

* * * * *